United States Patent
Schulze-Icking-Konert

(10) Patent No.: US 10,132,859 B2
(45) Date of Patent: Nov. 20, 2018

(54) ACTIVATION OF AN ELECTRICAL CONSUMER

(71) Applicant: Robert Bosch GmbH, Stuttgart (DE)

(72) Inventor: Georg Schulze-Icking-Konert, Buehlertal (DE)

(73) Assignee: ROBERT BOSCH GMBH, Stuttgart (DE)

( * ) Notice: Subject to any disclaimer, the term of this patent is extended or adjusted under 35 U.S.C. 154(b) by 107 days.

(21) Appl. No.: 14/890,648

(22) PCT Filed: Apr. 28, 2014

(86) PCT No.: PCT/EP2014/058573
§ 371 (c)(1),
(2) Date: Nov. 12, 2015

(87) PCT Pub. No.: WO2014/183979
PCT Pub. Date: Nov. 20, 2014

(65) Prior Publication Data
US 2016/0091558 A1 Mar. 31, 2016

(30) Foreign Application Priority Data
May 13, 2013 (DE) .................. 10 2013 208 683

(51) Int. Cl.
*G01R 31/28* (2006.01)
*H03K 17/06* (2006.01)
*H03K 17/08* (2006.01)
*H03K 17/18* (2006.01)
*G01R 31/40* (2014.01)
*H03K 17/687* (2006.01)

(52) U.S. Cl.
CPC ......... *G01R 31/2836* (2013.01); *G01R 31/40* (2013.01); *H03K 17/06* (2013.01);
(Continued)

(58) Field of Classification Search
CPC .. H01H 9/16; H01H 9/56; H01H 9/167; H02J 3/005; H03K 17/693; H03K 17/0822;
(Continued)

(56) References Cited

U.S. PATENT DOCUMENTS 6,407,594 B1 * 6/2002 Milazzo .................. H02M 1/08
327/112
7,005,882 B2 2/2006 Kiep
(Continued)

FOREIGN PATENT DOCUMENTS

DE 103 16 223 9/2004

*Primary Examiner* — Huy Q Phan
*Assistant Examiner* — Dustin Dickinson
(74) *Attorney, Agent, or Firm* — Norton Rose Fulbright US LLP; Gerard Messina

(57) ABSTRACT

A device (100) for activating an electrical consumer (105) includes a controllable current source (140) for providing a control current, a switching unit (115) for controlling a consumer current as a function of the control current, and a sampling unit (145) for determining a time delay between an activation of the current source (140) and the enabling or interruption of the current flow by the switching unit (115). Furthermore, a processing unit (135) is provided, which is configured to determine that the current source (140) is defective if the time delay lies outside a predetermined range.

9 Claims, 3 Drawing Sheets

(52) U.S. Cl.
CPC .............. *H03K 17/08* (2013.01); *H03K 17/18* (2013.01); *H03K 17/687* (2013.01)

(58) Field of Classification Search
CPC .............. H03K 17/042; H01R 31/3016; G01R 31/31937; G01R 31/2621
See application file for complete search history.

(56) References Cited

U.S. PATENT DOCUMENTS

| | | | | |
|---|---|---|---|---|
| 8,659,345 | B2* | 2/2014 | Xu | H02M 3/1588 |
| | | | | 327/427 |
| 9,459,635 | B2* | 10/2016 | Dally | G05F 1/10 |
| 2002/0180412 | A1* | 12/2002 | Yi | H03K 17/284 |
| | | | | 323/283 |
| 2003/0085750 | A1 | 5/2003 | Herzer et al. | |
| 2007/0058403 | A1 | 3/2007 | Oughton et al. | |
| 2008/0019063 | A1* | 1/2008 | Muller | H01H 9/56 |
| | | | | 361/42 |
| 2009/0044160 | A1* | 2/2009 | Bueti | G06F 17/5081 |
| | | | | 716/113 |
| 2011/0001486 | A1* | 1/2011 | Abouda | G01R 31/007 |
| | | | | 324/537 |
| 2011/0215751 | A1* | 9/2011 | Sato | H02M 7/53875 |
| | | | | 318/490 |
| 2011/0234185 | A1 | 9/2011 | Nagase et al. | |
| 2012/0262147 | A1* | 10/2012 | Wang | G01R 31/3278 |
| | | | | 324/76.11 |
| 2013/0107584 | A1 | 5/2013 | Li et al. | |

* cited by examiner

ACTIVATION OF AN ELECTRICAL CONSUMER

FIELD OF THE INVENTION

The present invention relates to a technology for activating an electrical consumer. In particular, the present invention relates to the determination of a degradation of a current source in an activation of the electrical consumer.

BACKGROUND INFORMATION

A switching unit, which is activated with the aid of a driver circuit, is used to activate an electrical consumer, to enable a current flow between the consumer and a predetermined potential. To keep waste heat low and electromagnetic compatibility high, it is possible to activate the switching unit for controlling the consumer current using a current source instead of using a voltage source. If the current source is activated, it thus delivers a predetermined control current to the switching unit, which permits a current flow through the consumer as a function of the control current. If the switching unit is constructed with the aid of a bipolar transistor, a current flow may thus be controllable in an analog manner as a function of the control current; in a specific embodiment having a field-effect transistor, another relationship may exist.

It is possible that the current source degrades on the basis of a thermal stress or an aging effect, that is to say, the control current provided thereby is excessively large or excessively small. It is then a concern that the switching unit will be overloaded, so that it may be damaged, or will not be sufficiently activated, so that it enables the current to move through the consumer excessively slowly or not at all. In a safety-critical application, for example, for activating an electric motor as a steering aid in a motor vehicle, the activation must meet specific reliability and safety requirements. Such requirements are stipulated, for example, in the specification ASIL (automotive safety integrity level) corresponding to ISO 26262.

SUMMARY OF THE INVENTION

It is an object of the present invention to provide a device for activating an electrical consumer, a method for determining a defect on a current source in the device, and a computer program product, with the aid of which predefined reliability and safety criteria may be met or improved. The present invention achieves this object with the aid of a device, a method, and a computer program product having the features of the descriptions herein. The further descriptions herein provide specific embodiments.

A device according to the present invention for activating an electrical consumer includes a controllable current source for providing a control current, a switching unit for controlling a consumer current as a function of the control current, and a sampling unit for determining a time delay between the activation of the current source and the enabling or interruption of a current flow by the switching unit. Furthermore, a processing unit is provided, which is configured to determine that the current source is defective if the time delay lies outside a predetermined range.

It is thus possible to determine early that the current source degrades, i.e., in particular it operates outside its specification as a result of slow changes or effects, in that the provided control current is excessively large or excessively small. For example, if the switching unit includes a field-effect transistor, initially a gate-source capacitance thus has to be charged during a switching-on procedure, then a Miller capacitance has to be discharged, and finally a gate-source capacitance has to be fully charged to enable complete gating of the field-effect transistor. If the current source provides an excessively large control current, the field-effect transistor may thus be damaged during the gating. If the provided control current is excessively small, the gating may take place more slowly or incompletely. In both cases, a function of a consumer connected to the switching unit may not be ensured under certain circumstances. The early determination of a degradation of the current source may therefore contribute to already recognizing an imminent fault early, in order to output a fault signal or take suitable countermeasures. The reliability and the safety of the device may thus be increased.

The direction of the control current is arbitrary; a negative control current may also be provided so that the current source practically operates as a current sink. The switching unit may alternatively enable or interrupt the current flow as a function of the control current. Hereafter, the case of a current source having a positive control current for enabling (turning on) a current by way of the control unit is presumed as an example.

In one variant, an external fault may also be determinable with the aid of the device, for example, a parallel connection between a gate of the field-effect transistor and a ground potential or an incorrect capacitor, which is connected to the gate.

If the switching unit includes a field-effect transistor, the sampling unit may thus be configured to determine a gate-source voltage of the field-effect transistor. The degree of the gating or the phase of the gating operation may be read off at the gate-source voltage. An integrated driver of the device may already include a sampling or processing unit for the gate-source voltage, for example, to detect a short-circuited switching unit during operation. An already existing device may thus be used to determine the control current of the current source via the described time delay.

The sampling unit may be configured to determine when the gate-source voltage has exceeded the plateau voltage of the field-effect transistor. If the control current is applied to the field-effect transistor, the gate-source voltage initially does not increase above a specific plateau voltage, before the Miller capacitance of the field-effect transistor is discharged. If the gate-source voltage exceeds the plateau voltage, almost the entire current flow is thus already typically enabled by the switching unit. A sufficiently precise determination of the point in time of the enabling of the current flow may thus be carried out.

If the switching unit includes a field-effect transistor, in an alternative specific embodiment, the sampling unit may thus be configured to determine a drain-source voltage of the field-effect transistor. If the drain-source voltage falls below a predetermined threshold value, the current flow is thus enabled by the switching unit. If the drain-source voltage exceeds the threshold value, the current flow is reliably interrupted by the switching unit. The comparison of the drain-source voltage to the threshold value may be carried out with the aid of the processing unit.

In another specific embodiment, a digital counter may be provided for counting pulses of a clock signal between the activation of the current source and the enabling or interruption of the current flow by the switching unit. The digital counter may already be provided in an integrated control device, to be able to study chronological sequences on the control device. The time delay may thus be determined in a simple and efficient manner.

A method according to the present invention for determining a defect on a current source for providing a control current for a switching unit includes steps of activating the current source, detecting a time delay until a current flow is enabled or interrupted by the switching unit, and determining that the current source is defective if the time delay lies outside a predetermined range.

In particular, it may be determined that the current source provides an excessively large control current if the time delay is less than the predetermined range. In a corresponding way, it may be determined that the current source provides an excessively small control current if the time delay is greater than the predetermined range.

A computer program product according to the present invention includes a program code arrangement for carrying out the described method when the computer program product is run on a processing unit or is stored on a computer-readable data carrier.

The present invention will be described in greater detail with reference to the appended figures.

DETAILED DESCRIPTION

Figure 1:
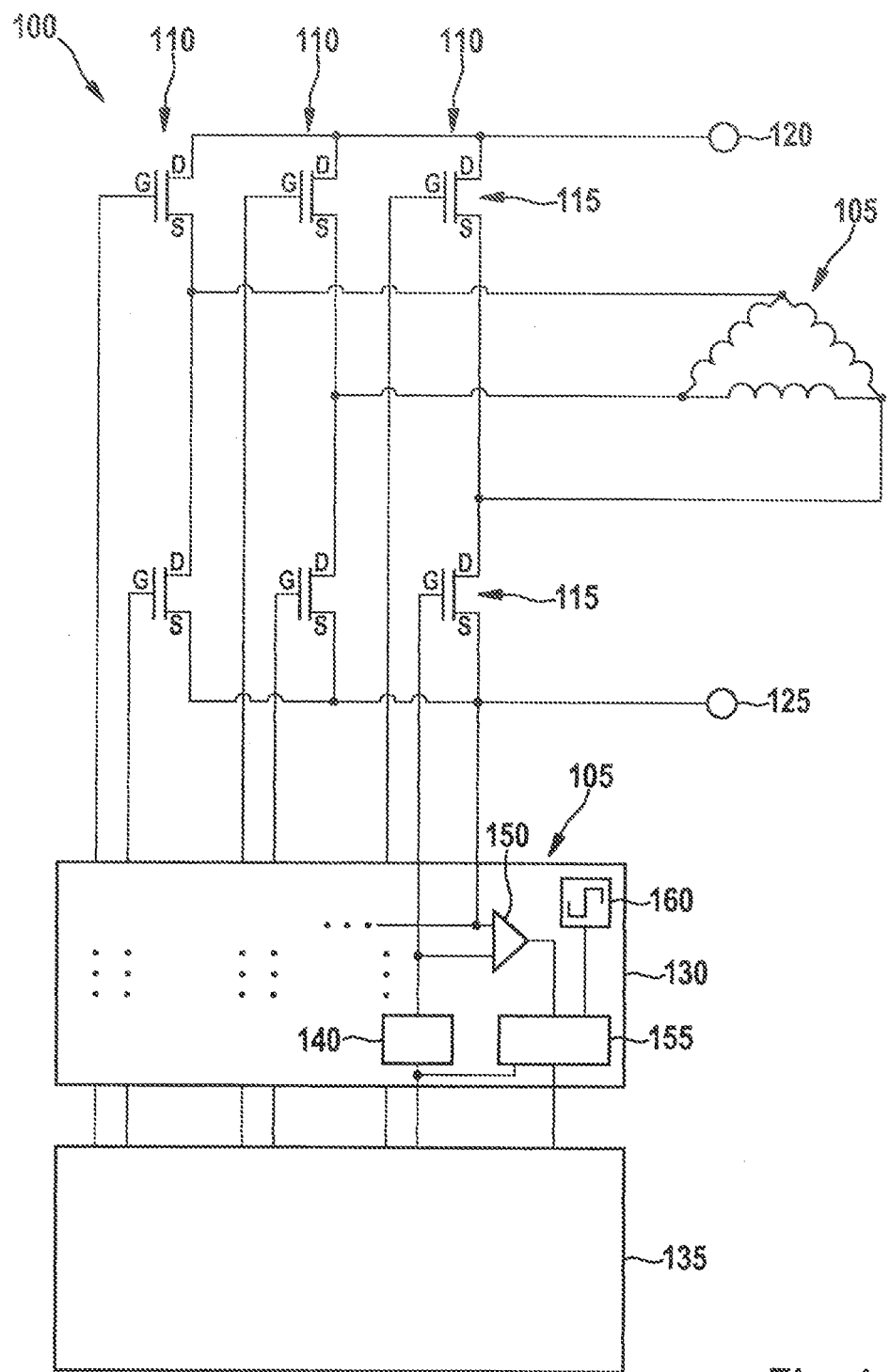
FIG. 1 shows a circuit diagram of a device for activating a consumer.

FIG. 1 shows a circuit diagram of a device 100 for activating a consumer 105. Although the provided technology is usable for activating an arbitrary number of switching units 115, the specific embodiment shown in FIG. 1 includes a somewhat more complex example having three half-bridges 110, each including two switching units 115, for activating a consumer 105, which is provided here as a three-phase electric motor in a delta connection. Illustrated switching units 115 are each provided as examples as N-channel field-effect transistors, in particular as MOSFETs. In FIG. 1, first switching units 115, which are shown on top, are each configured to enable a current flow from a first potential 120 into consumer 105 and, shown further down, second switching units 115 are each configured to enable a current from the consumer 105 to a second potential 125. A first switching unit 115 is also referred to as a high-side switch and a second switching unit 115 is also referred to as a low-side switch. In other specific embodiments, another configuration of switching units 115 is provided for enabling a current through consumer 105.

A driver 130, which may be integrated into switching units 115 and/or a processing unit 135, is typically provided for activating switching units 115. For reasons of clarity, elements of driver 130 are only shown for one of switching units 115 in FIG. 1; other switching units 115 may be activated in a corresponding way.

A current source 140 is provided for making available a control current for switching unit 115. If current source 140 is activated, in particular by control of processing unit 135, it thus provides a control current at switching unit 115, upon which this switching unit enables or interrupts the described current flow into consumer 105 or out of consumer 105. To avoid a short-circuit between potentials 120 and 125, it is to be ensured that both switching units 115 of a half bridge 110 do not enable a current flow simultaneously. The activation of both switching units 115 is typically carried out by processing unit 135, which has to ensure that the activations are offset in time so that a short-circuit does not take place. Because switching units 115 turn on or off with a delay upon a corresponding control current, the activations of current sources 140 may nonetheless be simultaneously active.

A sampling unit 145 is provided to determine a time delay between an activation of current source 140 and the enabling or interruption of the current flow by switching unit 115. In the illustrated specific embodiment, sampling unit 145 includes a monitoring unit 150 for the gate-source voltage of switching unit 115. In another alternative, the drain-source voltage of switching unit 115 may instead be monitored with the aid of monitoring unit 150. Monitoring unit 150 provides the sampled voltage or a signal when the sampled voltage has exceeded a predetermined threshold value. In the case of the gate-source voltage, this threshold value, as will be explained in greater detail hereafter, may be a plateau voltage of switching unit 115. Furthermore, sampling unit 145 includes a counter 155, which is configured to count pulses of a clock signal, which are provided by a clock generator 160.

Counter 155 is connected to current source 140 and monitoring unit 150 in such a way that the counting of the pulses begins when current source 140 is activated and ends when monitoring unit 150 provides a signal which indicates that the current flow is enabled or interrupted by switching unit 115. The counter content of counter 155 is subsequently an indication of the time delay between the activation of current source 140 and the enabling or interruption of the current flow by switching unit 115. This delay is typically primarily dependent on an input capacitance of switching unit 115, in particular a gate capacitance, if it is a field-effect transistor, a turning-on threshold of switching unit 115, and the current strength of the control current provided by current source 140. Because primarily the last-mentioned parameters of aging and temperature influences on current source 140 are interrupted, while the other parameters typically remain constant, a possible degradation of current source 140 may be determined on the basis of the determined time delay.

Figure 2:
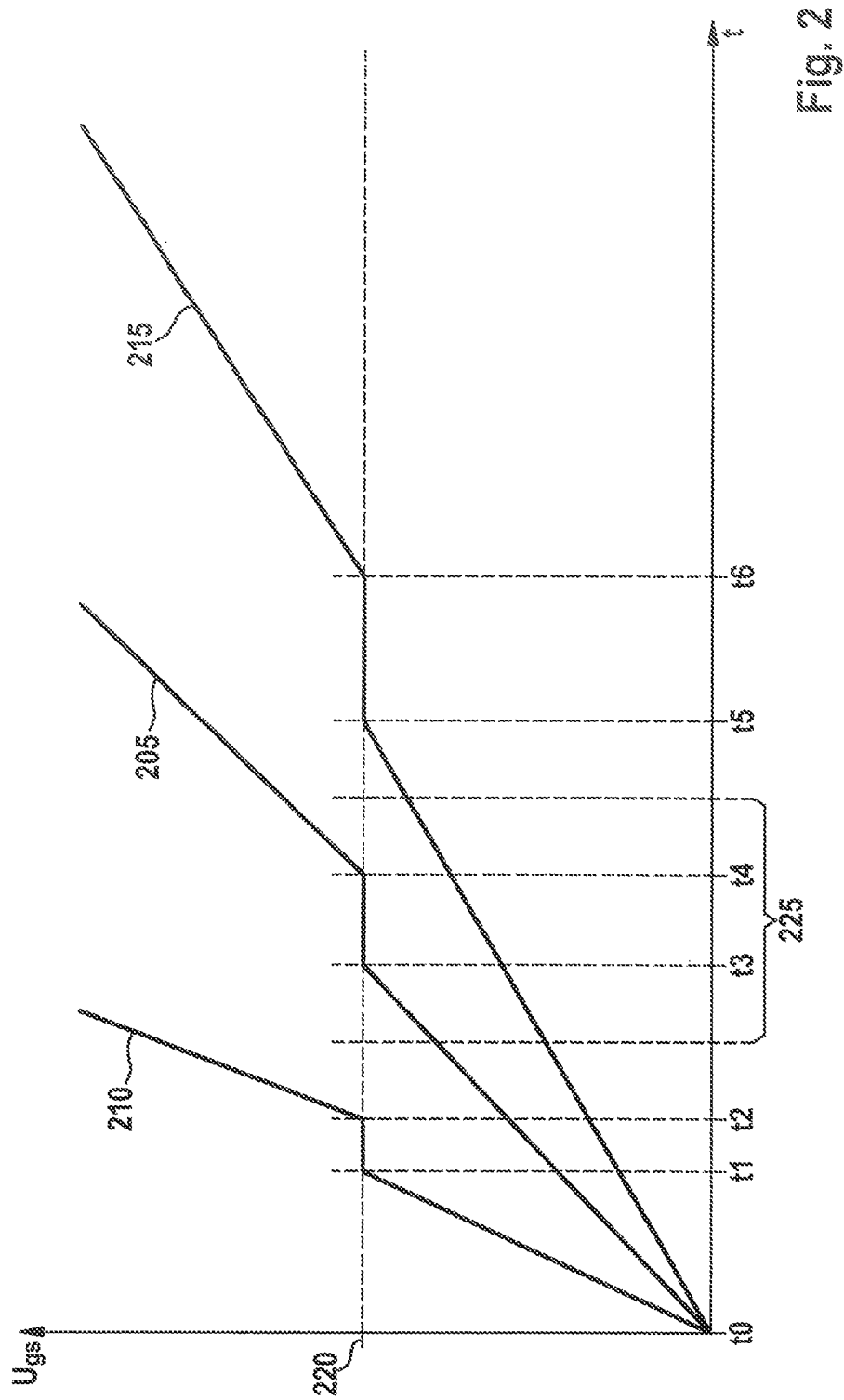
FIG. 2 shows time sequences on a switching unit of the device for FIG. 1.

FIG. 2 shows time sequences on a switching unit 115 of device 100 from FIG. 1. A time is plotted in the horizontal direction and a gate-source voltage of a field-effect transistor, which switching unit 115 is implemented as, is plotted in the vertical direction. A first sequence 205 begins when current source 140 applies the correct control current to switching unit 115. Current source 140 is activated at a point in time T0. From there, the gate-source voltage rises essentially linearly until point in time T3, at which it reaches a plateau voltage 220. During this interval, the gate-source capacitance of switching unit 115 is charged. The Miller capacitance of switching unit 115 is discharged between points in time T3 and T4. The gate-source voltage cannot exceed plateau voltage 220 during this time. Subsequently, the gate-source voltage rises further, while the gate-source capacitance is completely charged and switching unit 115 switches through completely.

If the control current of current source 140 is excessively large, a second sequence 210 thus results. Plateau voltage 220 is already reached at point in time T1 and left again at point in time T2; the gating takes place in an accelerated way. This operating mode is stressful for switching unit 115 and may result in defects, in addition, an emission of electromagnetic waves may thus be promoted, so that the device does not meet the requirements for electromagnetic compatibility (EMC) under certain circumstances. If the provided control current is excessively low, a third sequence 215 thus results. The provided control current is excessively low here. Plateau voltage 220 is only reached at point in time T5 and cancelled again at point in time T6. Additional stress of switching units 115 may thus be caused.

As already described above, it may be determined that switching unit 115 enables or interrupts a current flow through consumer 105 when the gate-source voltage exceeds plateau voltage 220. The time delay between the activation of current source 140 and the enabling or interruption of the current flow by switching unit 115 is (T4+T0) in first sequence 205, (T2−T0) in second sequence 210, and (T6−T0) in third sequence 215. With reference to point in time T0, a time range 225 may be specified in which the point in time should lie at which the gate-source voltage exceeds plateau voltage 220, to identify the control current provided by current source 140 as correct. If the precise point in time is before range 225, the control current is thus excessively high; if it is after range 225, it is thus excessively low.

Figure 3:
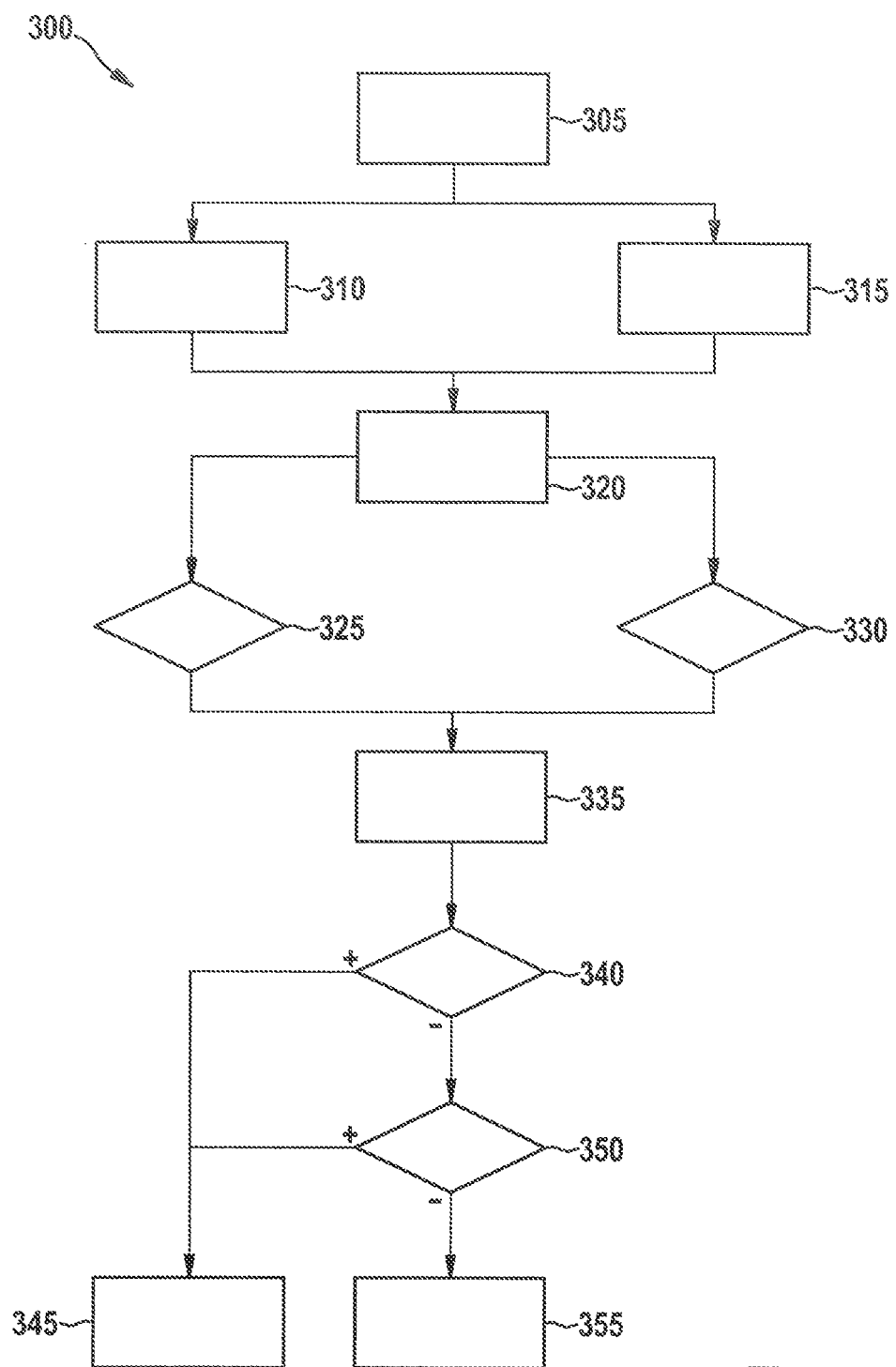
FIG. 3 shows a flow chart of a method for activating the consumer with the aid of the device from FIG. 1.

FIG. 3 shows a flow chart of a method 300 for activating consumer 105 with the aid of device 100 from FIG. 1. Method 300 begins in a step 305. Subsequently, a step 310, in which counter 155 is started, and a step 315, in which current source 140 is activated, may be performed simultaneously. It is then determined in a step 320 whether switching unit 115 enables or interrupts the current flow through consumer 105. If switching unit 115 is a field-effect transistor, in a first variant, it may be determined in a step 325 whether the gate-source voltage exceeds plateau voltage 220. In a second variant, it may be determined in a step 330 whether the drain-source voltage is less than a predetermined threshold value. If one of the conditions applies, counter 155 is thus stopped in a step 335. Presuming that counter 155 counts upward, it is checked in a step 340 whether the counter content exceeds an upper limit. If this is the case, the control current provided by current source 140 is excessively small and a degradation of current source 140 is determined in a step 345. If the counter content is less than the upper limit, it may thus be determined in a step 350 whether the counter content is less than a lower limit. If this is the case, the control current of current source 140 is thus excessively large and a degradation of current source 140 is likewise determined in step 345. Otherwise, the counter content is between the lower limit and the upper limit and it is determined in a step 355 that current source 140 does not degrade, i.e., is not defective.

What is claimed is:

1. A device for activating an electrical consumer, comprising:
   a controllable current source to provide a control current;
   a switching unit to control a consumer current as a function of the control current;
   a sampling unit to determine a time delay between an activation of the current source and the enabling or interruption of a current flow by the switching unit; and
   a processing unit to determine that the current source is defective if the time delay is outside a predetermined range.

2. The device of claim 1, wherein the switching unit includes a field-effect transistor and the sampling unit is configured to determine a gate-source voltage of the field-effect transistor.

3. The device of claim 2, wherein the sampling unit is configured to determine when the gate-source voltage has exceeded the plateau voltage of the field-effect transistor.

4. The device of claim 1, wherein the switching unit includes a field-effect transistor and the sampling unit is configured to determine a drain-source voltage of the field-effect transistor.

5. The device of claim 1, further comprising:
   a digital counter to count pulses of a clock signal between the activation of the current source and the enabling or interruption of the current flow by the switching unit.

6. A method for determining a defect on a current source for providing a control current for a switching unit, the method comprising:
   activating the current source;
   detecting a time delay until a current flow is enabled or interrupted by the switching unit; and
   determining that the current source is defective if the time delay is outside a predetermined range.

7. The method of claim 6, wherein it is determined that the current source provides an excessively large control current if the time delay is less than the predetermined range.

8. The method of claim 6, wherein it is determined that the current source provides an excessively small control current if the time delay is greater than the predetermined range.

9. A non-transitory computer readable medium having a computer program, which is executable by a processor, comprising:
   a program code arrangement having program code for determining a defect on a current source for providing a control current for a switching unit, by performing the following:
   activating the current source;
   detecting a time delay until a current flow is enabled or interrupted by the switching unit; and
   determining that the current source is defective if the time delay is outside a predetermined range.

* * * * *